United States Patent
Zhang et al.

(10) Patent No.: US 12,123,292 B1
(45) Date of Patent: Oct. 22, 2024

(54) DIFFERENTIATED REAL-TIME INJECTION-PRODUCTION OPTIMIZATION ADJUSTMENT METHOD OF INTELLIGENT INJECTION-PRODUCTION LINKAGE DEVICE

(71) Applicants: QINGDAO UNIVERSITY OF TECHNOLOGY, Qingdao (CN); CHINA UNIVERSITY OF PETROLEUM (EAST CHINA), Qingdao (CN)

(72) Inventors: Kai Zhang, Qingdao (CN); Guojing Xin, Qingdao (CN); Zhongzheng Wang, Qingdao (CN); Piyang Liu, Qingdao (CN); Liming Zhang, Qingdao (CN); Xia Yan, Qingdao (CN); Huaqing Zhang, Qingdao (CN); Zifeng Sun, Qingdao (CN); Feng Jia, Qingdao (CN)

(73) Assignees: QINGDAO UNIVERSITY OF TECHNOLOGY, Qingdao (CN); CHINA UNIVERSITY OF PETROLEUM (EAST CHINA), Qingdao (CN)

(*) Notice: Subject to any disclaimer, the term of this patent is extended or adjusted under 35 U.S.C. 154(b) by 0 days.

(21) Appl. No.: 18/606,428

(22) Filed: Mar. 15, 2024

(30) Foreign Application Priority Data

Jun. 5, 2023 (CN) .......................... 202310652248.5

(51) Int. Cl.
*E21B 43/16* (2006.01)
*G06F 30/28* (2020.01)
*G06N 3/092* (2023.01)

(52) U.S. Cl.
CPC .............. *E21B 43/16* (2013.01); *G06F 30/28* (2020.01); *G06N 3/092* (2023.01); *E21B 2200/20* (2020.05)

(58) Field of Classification Search
CPC ..... E21B 43/16; E21B 2200/20; G06N 3/092; G06F 30/28
See application file for complete search history.

(56) References Cited

U.S. PATENT DOCUMENTS 10,198,535 B2 * 2/2019 Usadi ................. G06F 30/23
2020/0302293 A1 * 9/2020 Liu ..................... G06Q 50/02
(Continued)

FOREIGN PATENT DOCUMENTS

CN          115222140 A     10/2022

OTHER PUBLICATIONS

Zhang, K., et al. "Training effective deep reinforcement learning agents for real-time life-cycle production optimization" J. Petroleum Science & Engineering, vol. 208 (2021) (Year: 2021).*
(Continued)

*Primary Examiner* — Jay Hann
(74) *Attorney, Agent, or Firm* — HAUPTMAN HAM, LLP

(57) ABSTRACT

A differentiated real-time injection-production optimization adjustment method of an intelligent injection-production linkage device belongs to the field of oil reservoir injection-production technologies. The method includes: initializing networks; building an injection-production environment model; by an agent, reading an initial state of an injection-production environment; writing a file by an injection-production policy network; obtaining state data of the moment t+1; reading a next state and an economic net present value within the time step; assigning the next state to the current state until a to-be-optimized production period
(Continued)

is completed; by batch training on the model, updating a parameter of the environment agent model; updating a parameter of the action evaluation network and a parameter of the injection-production policy network; repeating the above steps until an optimal model is obtained; based on the stored optimal model, linking the intelligent injection-production device to obtain state information of the oil reservoir.

5 Claims, 3 Drawing Sheets

(56) References Cited

U.S. PATENT DOCUMENTS

2022/0164657 A1* 5/2022 He .................... E21B 43/00
2022/0220828 A1* 7/2022 Hegde ............... E21B 43/30

OTHER PUBLICATIONS

Zhao, M., et al. "A surrogate-assisted multi-objective evolutionary algorithm with dimension-reduction for production optimization" J. Petroleum Science & Engineering, vol. 192, No. 107192 (2020) (Year: 2020).*

Qin, C., et al. "Some effective tricks are used to improve Soft Actor Critic" J. Physics: Conf. series, 2010 012061 (2021) (Year: 2021).*

De Paola, G., et al. "Reinforcement Learning for Field Development Policy Optimization" SPE-201254-MS (2020) (Year: 2020).*

Nasir, Y. "Deep Reinforcement Learning for Field Development Optimization" arXiv:2008.12627v1 (2020) (Year: 2020).*

Duong, V. "Intro to reinforcement learning: temporal difference learning, SARSA vs. Q-learning" Medium (2021) available at <https://towardsdatascience.com/intro-to-reinforcement-learning-temporal-difference-learning-sarsa-vs-q-learning-8b4184bb4978> (Year: 2021).*

First Office Action in Corresponding Chinese Application No. 202310652248.5, dated Jul. 13, 2023; 17 pgs.

Notice of Grant in Corresponding Chinese Application No. 202310652248.5, dated Aug. 22, 2023; 3 pgs.

Search Report in Corresponding Chinese Application No. 202310652248.5, dated Jul. 11, 2023; 5 pgs.

Second Office Action in Corresponding Chinese Application No. 202310652248.5, dated Aug. 5, 2023; 22 pgs.

* cited by examiner

DIFFERENTIATED REAL-TIME INJECTION-PRODUCTION OPTIMIZATION ADJUSTMENT METHOD OF INTELLIGENT INJECTION-PRODUCTION LINKAGE DEVICE

RELATED APPLICATIONS

The present application claims priority from Chinese Application Number 202310652248.5 filed Jun. 5, 2023, the disclosure of which is hereby incorporated by reference herein in its entirety.

TECHNICAL FIELD

The present disclosure relates to the field of oil reservoir injection-production technologies and in particular to a differentiated real-time injection-production optimization adjustment method of an intelligent injection-production linkage device.

BACKGROUND

In the actual production process of the oil fields, due to reasons such as temporary modification of processes or failure of equipment and the like, the actual production system cannot be carried out strictly based on the production solutions. It is necessary to carry out adjustment to the optimization solutions based on current actual production solutions. But, in the existing injection-production optimization methods, the existing information has a low utilization rate and multiple iterations are required for one optimization, leading to failing to carry out adjustment in real time. Therefore it is required to improve the formulation efficiency and accuracy of the optimal injection-production system in the oil reservoir injection-production linkage process. The reinforcement learning algorithm can make decision based on a current state observed by an agent so as to embed an oil reservoir state into the injection-production optimization decision process, satisfying the needs of carrying out quick re-decision after adjustment to the on-site solution. Most of the existing reinforcement learning methods use on-site data as input and rely heavily on oil reservoir numerical simulation model in an application environment, failing to achieve the linkage of the oil reservoir and the intelligent injection-production device and autonomous correction of the solution system.

As a result, it is required to develop an oil reservoir injection-production optimization method having a utilization rate for existing information, requiring no repeated optimization iterations and capable of achieving real-time adjustment based on a current production solution.

SUMMARY

The main object of the present disclosure is to provide a differentiated real-time injection-production optimization adjustment method of an intelligent injection-production linkage device so as to solve the problems of low utilization rate for existing information, multiple iterations for one optimization, and inability to carry out real-time adjustment and thus improve the system efficiency and accuracy of the optimal injection-production system in the oil reservoir injection-production linkage process.

In order to achieve the above purposes, the present disclosure provides a differentiated real-time injection-production optimization adjustment method of an intelligent injection-production linkage device, which specifically includes the following steps: S1, initializing an injection-production policy network, an action evaluation network and an environment agent network; S2, based on to-be-optimized oil reservoir numerical simulation model, writing an injection-production environment model, wherein the injection-production environment model includes a file reading module and a system writing module, the file reading module completes state reading function and the system writing module achieves environment state transfer; S3, by agents the injection-production policy network and the action evaluation network, reading an initial state of an injection-production environment, namely, reading injection-production amount data $S_0$ of an oil/water well at the moment of $T_0$; S4, inputting a current state $S_t$ into an injection-production policy model, outputting an injection-production system $A_t$ and writing the injection-production system $A_t$ into the oil reservoir numerical simulation model; S5, based on the injection-production system $A_t$, running, by the injection-production environment model, the oil reservoir numerical simulation model to simulate a state of an oil reservoir at a next time step, so as to obtain state data of the moment of t+1; S6, reading, by the agent, a next state $S_{t+1}$ and an economic net present value $NPV_t$ within the time step and placing $\{S_t, A_t, S_{t+1}, NPV_t\}$ into a sample database; S7, assigning the next state to the current state, namely, letting $S_t=S_{t+1}$, then performing cycling until a to-be-optimized production period is completed; S8, performing data sampling in the sample database, and based on a sample prediction error, assigning a weight value to the samples and updating a parameter of the environment agent network by iteration update; S9, performing data sampling in the sample database, and updating a parameter of the action evaluation network and a parameter of the injection-production policy network; S10, repeating the steps S4 to S9 until iteration convergence conditions are satisfied so as to obtain an optimal injection-production policy model and an environment agent model; S11, based on the stored optimal injection-production policy model, inputting oil reservoir state information obtained by the intelligent injection-production device into the optimal injection-production policy model to output a complete production system and realize real-time injection-production optimization.

Furthermore, the step S1 specifically includes the following steps:

S1.1, using $\theta$ parameterized neural network $\pi_\theta(S_t)$ to represent the injection-production policy network, wherein the input of the injection-production policy network is the state $S_t$ observed by the agent and the output of the injection-production policy network is the injection-production system of the oil/water well;

based on the numbers of oil wells and water wells, setting the numbers of input neurons and output neurons;

wherein the specific input information includes a daily liquid production amount, a daily oil production amount, an accumulated liquid production amount, an accumulated injection amount, a water cut, a daily injection amount, an accumulated injection amount and a downhole pressure of the oil/water well, which are input in the form of vector, and the above information is measured and recorded in real time in a production process of an oil field;

S1.2, using $\omega$ parameterized neural network $V_\omega(S_t, A_t)$ to represent the action evaluation network, wherein the input of the action evaluation network is the state $S_t$ and the injection-production system $A_t$ of the oil/water well, and the output of the action evaluation network is an NPV prediction value calculated based on the injection-production system $A_t$ under the state $S_t$;

S1.3, using $\phi$ parameterized neural network $U_\phi(S_t, A_t)$ to represent the environment agent network, wherein the input is the current state $S_t$ and the injection-production system $A_t$, and the output is the next state $S_{t+1}$.

Furthermore, the injection-production environment model in the step S2 includes a state transfer part, a state reading part and a reward obtaining part:

the state transfer part is used to transfer the injection-production environment model from the current state $S_t$ to the next state $S_{t+1}$ based on the injection-production system, wherein the state transfer is performed based on the oil-water two-phase flow equations of Formula (1), Formula (2) and Formula (3);

$$v_w = -\frac{KK_{rw}}{\mu_w}\nabla p_w \qquad (1)$$

$$v_o = -\frac{KK_{ro}}{\mu_o}\nabla p_o \qquad (2)$$

$$p_c = p_o - p_w \qquad (3)$$

wherein $p_c$ is a capillary pressure in the unit of kPa; $v_w$ and $v_o$ are seepage velocities of the water phase and the oil phase in the unit of cm/s; $\mu_o$ and $\mu_w$ are viscosities of oil and water respectively in the unit of mPa·s; $p_w$ and $p_o$ are pressures of the water phase and the oil phase, in the unit of kPa; K is an absolute permeability of rocks, in the unit of $um^2$; $K_{rw}$ and $K_{ro}$ are relative permeabilities of the water phase and the oil phase, wherein this step is performed based on the oil reservoir numerical simulation model;

the state reading part is used to read the state observed by the agent, wherein the state observed by the agent is production log data recorded in real time in an oil field production site, as shown in Formula (4);

$$s_t = \begin{Bmatrix} wopt_{o,1}, \ldots, wopt_{o,i}, \ldots, wopt_{o,n}, wopr_{o,1}, \ldots, wopr_{o,i}, \ldots, wopr_{o,n}, \\ wlpt_{o,1}, \ldots, wlpt_{o,i}, \ldots, wlpt_{o,n}, wlpr_{o,1}, \ldots, wlpr_{o,i}, \ldots, wlpr_{o,n}, \\ wwit_{w,1}, \ldots, wwit_{w,i}, \ldots, wwit_{w,m}, wwir_{w,1}, \ldots, wwir_{w,i}, \ldots, wwir_{w,m}, \\ wbhp_{o,1}, \ldots, wbhp_{o,i}, \ldots, wbhp_{o,n}, wbhp_{w,1}, \ldots, wbhp_{w,i}, \ldots, wbhp_{w,m} \end{Bmatrix} \qquad (4)$$

wherein $wopt_{o,i}$ is the accumulated oil production amount of the i-th oil well, $wopr_{o,i}$ is the daily oil production amount of the i-th oil well, $wlpt_{o,i}$ is the accumulated liquid production amount of the i-th oil well, $wlpr_{o,i}$ is the daily liquid production amount of the i-th oil well, $wwit_{w,i}$ is the accumulated injection amount of the i-th water well, $wwir_{w,i}$ is the daily injection amount of the i-th water well, $wbhp_{o,i}$ is the downhole pressure of the i-th oil well, and $wbhp_{w,i}$ is the downhole pressure of the i-th water well;

the reward obtaining part performs calculation of the economic net present value by reading the accumulated oil production amount, the accumulated water production amount and the accumulated water injection amount of the oil reservoir numerical simulation model in an optimization stage.

Furthermore, in the step S3, the injection-production amount data $S_0$ of the oil/water well at the moment $T_0$ includes: a daily liquid production amount, a daily oil production amount, an accumulated liquid production amount, an accumulated oil production amount, a water cut, a daily injection amount, an accumulated injection amount, and a downhole pressure of the oil/water well, wherein the above data is input in the form of vector.

Furthermore, the step S4 specifically includes the following steps:

S4.1, outputting, by the injection-production policy model, the injection-production system $A_t$, as shown in Formula (5):

$$A_t = [W_{prd,1}, \ldots, W_{prd,i}, \ldots, W_{prd,N_{prd}}, \\ W_{inj,1}, \ldots, W_{inj,i}, \ldots, W_{inj,N_{inj}}] \qquad (5)$$

wherein $W_{prd,i}$ is a liquid production amount of the i-th production well, and $W_{inj,i}$ is a water injection rate of the i-th water injection well;

S4.2, obtaining the injection-production system $A_t$, and inputting the injection-production system $A_t$ into the oil reservoir numerical simulation model.

Furthermore, the $NPV_t$ in the step S6 is the economic net present value of the current time step, calculated as in Formula (6):

$$NPV_t = c_1 P_t^{oil} - c_2 P_t^{water} - c_3 I_t^{water} \qquad (6)$$

wherein $P_t^{oil}$ is the accumulated oil production amount within the current time step in the unit of STB; $P_t^{water}$ is the accumulated water production amount of a block, in the unit of STB; $I_t^{water}$ is the accumulated injection amount in the unit of STB; $c_1$ is the price of crude oil, in the unit of Yuan/STB; $c_2$ is a treatment cost of oil-field-produced water, in the unit of Yuan/STB; $c_3$ is an injected water cost in the unit of Yuan/STB.

Furthermore, the step S8 specifically includes the following steps:

S8.1, performing sample data sampling in the sample database to train the environment agent model and define a sampling probability as:

$$P(i) = \frac{p_i^\alpha}{\sum_k p_i^\alpha} \qquad (7)$$

wherein $p_i$ is the i-th priority defined in $p_i = |\xi_i| + \delta$, wherein $\xi_i$ is a deviation between a predicted value and an actual value, $\delta$ is used to prevent the probability from being 0; $\alpha$ is an exponential hyperparameter and $\alpha=0$ corresponds to uniform sampling, and k refers to the number of data samples;

S8.2, updating the environment agent network based on gradient descent method and a loss function used for the update is as shown in Formula (8):

$$loss(x, y) = \frac{1}{n}\sum_{i=1}^{n}|y_i - f(x_i)| \qquad (8)$$

wherein $f(x_i)$ is a model prediction value of a sample $x_i$, $y_i$ is a true value, and n is a number of the collected samples.

Furthermore, the step S9 specifically includes the following steps:

S9.1, performing sampling on the samples collected in real time in the sample database, and based on the stored production data $S_t$ of the oil reservoir at the current moment, the injection-production system $A_t$ generated by the agent, the economic net present value $NPV_{t+1}$ and the oil reservoir state data $S_{t+1}$ of the next moment, evaluating a policy executed by the current injection-production policy network and updating a parameter $\omega$ of the action evaluation network:

$$\delta_t = NPV_{t+1} + \gamma V_\omega(s_{t+1}, A_{t+1}) - V_\omega(s_t, A_t) \quad (9)$$

$$\omega = \omega + \lambda_\omega \cdot \delta_t \cdot \nabla_\omega V_\omega(s_t, A_t) \quad (10)$$

wherein $NPV_{t+1}$ is the economic net present value of the moment t+1, $\gamma$ is a discount factor, $V_\omega(s_t, A_t)$ is an estimate of a value function of the execution action $A_t$ under the state $s_t$, $\omega$ is a parameter of a neural network, $\nabla_\omega$ refers to solving a gradient for $\omega$, $\lambda_\omega$ is a learning rate, and $\delta_t$ is a temporal differential error;

S9.2, based on the production data $S_t$ of the oil reservoir at the current moment, the injection-production system $A_t$ generated by the agent and $\delta_t$ returned by the action evaluation network, updating the parameter $\theta$ of the injection-production policy network in the following Formula:

$$\theta \leftarrow \theta + \lambda_\theta \cdot \delta_t \cdot \nabla_\theta \log \pi_\theta(a_t|s_t) \quad (11)$$

wherein $\theta$ is the parameter of the injection-production policy network, $\delta_t$ is an output value of the action evaluation network, $\nabla_\theta$ refers to solving a gradient for $\theta$; $\lambda_\theta$ is the learning rate, $\pi_\theta(a_t|s_t)$ is a possibility of the execution action $a_t$ under the state $s_t$.

Furthermore, the iteration convergence conditions in the step S10 include: whether the iteration number reaches a maximum upper limit of a preset stop criterion; if the preset upper limit is reached, calculation is ended and the current injection-production policy model and environment agent model are output; if not, the steps S4 to S9 are repeated.

The present disclosure has the following beneficial effects.

In the present disclosure, based on the reinforcement learning algorithm and the injection-production policy model, by using the development index data collected in the actual production process, such as the accumulated oil production amount, the daily oil production amount, the accumulated liquid production amount, the daily liquid production amount, the accumulated injection amount and the daily injection amount and the like, optimization is performed on a future injection-production solution policy Furthermore, the data in the reinforcement learning sampling process is used to train the environment agent model such that, in a case of application, subsequent multistep offline optimization can be achieved and the utilization rate for the existing information can be improved. In this case, it is not required to perform the costly optimization process repeatedly. The main use of the method of the present disclosure is to perform fast oil-reservoir injection-production optimization, bringing good promotion and application value.

BRIEF DESCRIPTIONS OF THE DRAWINGS

In order to more clearly describe the technical solutions in the specific embodiments of the present disclosure and in the prior arts, drawings required for descriptions of the specific embodiments or the prior arts will be briefly introduced below. Apparently, the drawings described hereunder are only some embodiments of the present disclosure. Those skilled in the arts can obtain other drawings based on these drawings without carrying out creative work.

Figure 4:
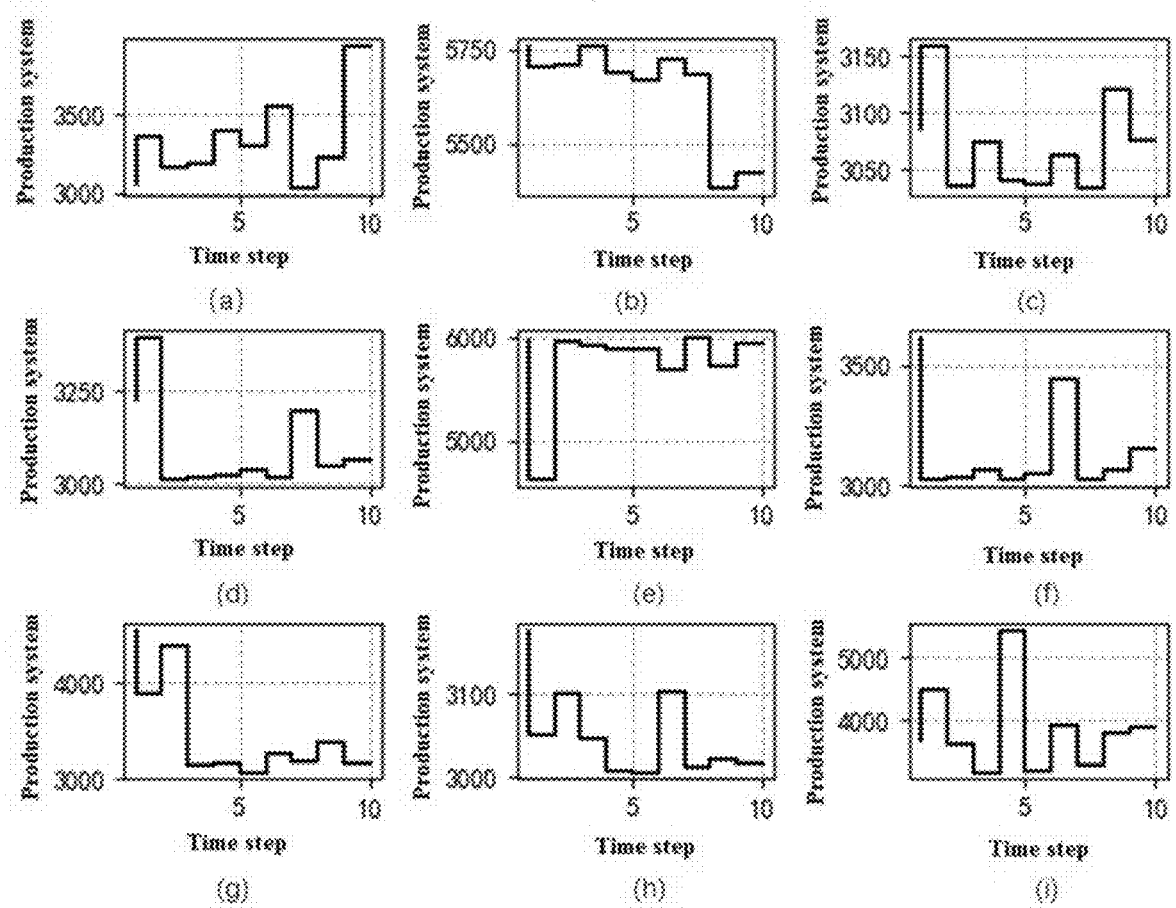

FIG. 4 is a schematic diagram illustrating liquid production amount data after performing optimization on some production wells by using the differentiated real-time injection-production optimization adjustment method of the intelligent injection-production linkage device in the present disclosure; (a) shows production system data of each time step of the production well PRO-01; (b) shows production system data of each time step of the production well PRO-02; (c) shows production system data of each time step of the production well PRO-03; (d) shows production system data of each time step of the production well PRO-04; (e) shows production system data of each time step of the production well PRO-05; (f) shows production system data of each time step of the production well PRO-06; (g) shows production system data of each time step of the production well PRO-07; (h) shows production system data of each time step of the production well PRO-08; and (i) shows production system data of each time step of the production well PRO-09.

Figure 5:
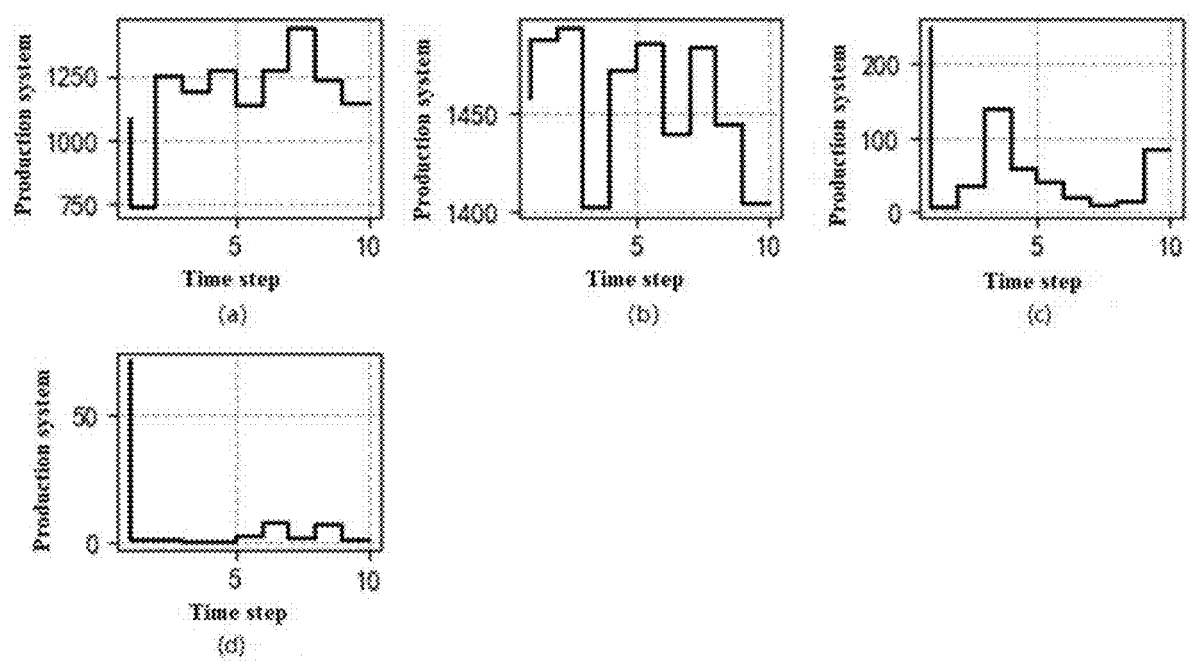

FIG. 5 is a schematic diagram illustrating injection amount data after performing optimization on some water injection wells by using the differentiated real-time injection-production optimization adjustment method of the intelligent injection-production linkage device in the present disclosure; (a) shows production system data of each time step of the water injection well INJ-01; (b) shows production system data of each time step of the water injection well INJ-02; (c) shows production system data of each time step of the water injection well INJ-03; (d) shows production system data of each time step of the water injection well INJ-04.

DETAILED DESCRIPTIONS OF EMBODIMENTS

The technical solutions of the present disclosure will be fully and clearly described in combination with drawings. Apparently, the embodiments described herein are only some embodiments of the present disclosure rather than all embodiments. All other embodiments obtained by those skilled in the arts based on these embodiments in the present disclosure without carrying out creative work shall fall within the scope of protection of the present disclosure.

With an oil reservoir model as an example, the method in the present disclosure is tested. This model is an oil/water dual-phase black oil model with the model mesh size being 25*25. In this block, there are a total of 13 wells including nine production wells and four injection wells. The wells are distributed by the inverted five-spot well pattern. There are a total of 10 time steps, each of which represents 180 days.

Injection-production optimization is performed on this model. The decision variable is of 13*10=130 dimensions.

There is provided a differentiated real-time injection-production optimization adjustment method of an intelligent injection-production linkage device, which specifically includes the following steps.

Figure 1:
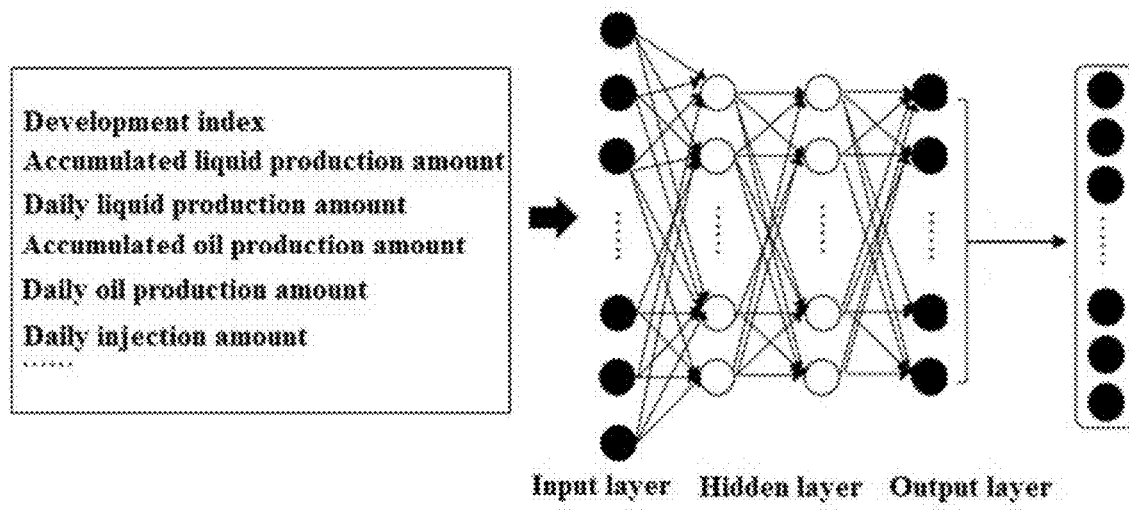
FIG. 1 is a schematic diagram illustrating an injection-production policy network in the differentiated real-time injection-production optimization adjustment method of the intelligent injection-production linkage device in the present disclosure.

At step S1, an injection-production policy network, an action evaluation network and an environment agent network are initialized. The action space is 1×13, the state space is 1×66. The injection-production policy network is a network as shown in FIG. 1. The input layer includes 66 neurons and there are two hidden layers. The activation function is Relu function. The output layer includes 13 neurons which respectively output the production system of each well.

Specifically, the step S1 specifically includes the following steps: at step S1.1, $\theta$ parameterized neural network $\pi_\theta(S_t)$ is used to represent the injection-production policy network, wherein the input of the injection-production policy network is a state $S_t$ observed by an agent and the output of the injection-production policy network is an injection-production system $A_t$ of an oil/water well.

Based on the numbers of oil wells and water wells, the numbers of input neurons and output neurons are set; wherein the number of the input neurons is $(N_{oil}*6+ N_{water}*3)$, and the number of the output neurons is $(N_{oil}+ N_{water})$, where $N_{oil}$ represents the number of the oil wells, $N_{water}$ represents the number of the water wells; the specific input information includes a daily liquid production amount, a daily oil production amount, an accumulated liquid production amount, an accumulated injection amount, a water cut, a daily injection amount, an accumulated injection amount and a downhole pressure of the oil/water well, which are input in the form of vector, and the above information is measured and recorded in real time in a production process of an oil field.

At step S1.2, $\omega$ parameterized neural network $V_\omega(S_t, A_t)$ is used to represent the action evaluation network, wherein the input of the action evaluation network is the state $S_t$ and the injection-production system $A_t$ of the oil/water well, and the output of the action evaluation network is an NPV prediction value calculated based on the injection-production system $A_t$ under the state $S_t$.

At step S1.3, $\phi$ parameterized neural network $U_\phi(S_t, A_t)$ is used to represent the environment agent network, wherein the input is the current state $S_t$ and the injection-production system $A_t$, and the output is the next state $S_{t+1}$. In an application stage, the environment agent network can obtain the state of the next moment without the oil reservoir numerical simulation model.

At step S2, based on to-be-optimized oil reservoir numerical simulation model, an injection-production environment model is written, wherein the injection-production environment model includes a file reading module and a system writing module, the file reading module completes state reading function and the system writing module achieves environment state transfer.

Specifically, the injection-production environment model in the step S2 includes a state transfer part, a state reading part and a reward obtaining part: the state transfer part is used to transfer the injection-production environment model from the current state $S_t$ to the next state $S_{t+1}$ based on the injection-production system, wherein the state transfer is performed based on the oil-water two-phase flow equations of Formula (1), Formula (2) and Formula (3):

$$v_w = -\frac{KK_{rw}}{\mu_w}\nabla p_w \tag{1}$$

$$v_o = -\frac{KK_{ro}}{\mu_o}\nabla p_o \tag{2}$$

$$p_c = p_o - p_w \tag{3}$$

wherein $p_c$ is a capillary pressure in the unit of kPa; $v_w$ and $v_o$ are seepage velocities of the water phase and the oil phase in the unit of cm/s; $\mu_o$ and $\mu_w$ are viscosities of oil and water respectively in the unit of mPa·s; $p_w$ and $p_o$ are pressures of the water phase and the oil phase, in the unit of kPa; K is an absolute permeability of rocks, in the unit of um$^2$; $K_{rw}$ and $K_{ro}$ are relative permeabilities of the water phase and the oil phase, wherein this step is performed based on the oil reservoir numerical simulation model.

The state reading part is used to read the state observed by the agent, wherein the state observed by the agent is production log data recorded in real time in an oil field production site, as shown in Formula (4);

$$s_t = \begin{cases} wopt_{o,1}, \ldots, wopt_{o,i}, \ldots, wopt_{o,n}, wopr_{o,1}, \ldots, wopr_{o,i}, \ldots, wopr_{o,n}, \\ wlpt_{o,1}, \ldots, wlpt_{o,i}, \ldots, wlpt_{o,n}, wlpr_{o,1}, \ldots, wlpr_{o,i}, \ldots, wlpr_{o,n}, \\ wwit_{w,1}, \ldots, wwit_{w,i}, \ldots, wwit_{w,m}, wwir_{w,1}, \ldots, wwir_{w,i}, \ldots, wwir_{w,m}, \\ wbhp_{o,1}, \ldots, wbhp_{o,i}, \ldots, wbhp_{o,n}, wbhp_{w,1}, \ldots, wbhp_{w,i}, \ldots, wbhp_{w,m} \end{cases} \tag{4}$$

wherein $wopt_{o,i}$ is the accumulated oil production amount of the i-th oil well, $wopr_{o,i}$ is the daily oil production amount of the i-th oil well, $wlpt_{o,i}$ is the accumulated liquid production amount of the i-th oil well, $wlpr_{o,i}$ is the daily liquid production amount of the i-th oil well, $wwit_{w,i}$ is the accumulated injection amount of the i-th water well, $wwir_{w,i}$ is the daily injection amount of the i-th water well, $wbhp_{o,i}$ is the downhole pressure of the i-th oil well, and $wbhp_{w,i}$ is the downhole pressure of the i-th water well.

The reward obtaining part performs calculation of the economic net present value by reading the accumulated oil production amount, the accumulated water production amount and the accumulated water injection amount of the oil reservoir numerical simulation model in an optimization stage.

At step S3, by agents the injection-production policy network and the action evaluation network, an initial state of an injection-production environment is read, namely, injection-production amount data $S_0$ of an oil/water well at the moment of $T_0$ is read.

Specifically, in the step S3, the injection-production amount data $S_0$ of the oil/water well at the moment $T_0$ includes: a daily liquid production amount, a daily oil production amount, an accumulated liquid production amount, an accumulated oil production amount, a water cut, a daily injection amount, an accumulated injection amount, and a downhole pressure of the oil/water well, wherein the above data is input in the form of vector. The above data is measured and recorded in real time in the production process of the oil field.

At step S4, the current state $S_t$ is input into an injection-production policy model, the injection-production system $A_t$ is output and the injection-production system $A_t$ is written into the oil reservoir numerical simulation model.

Specifically, the step S4 specifically includes the following steps:

At S4.1, the injection-production policy model outputs the injection-production system $A_t$, namely, an injection-production amount of a to-be-optimized well, as shown in Formula (5):

$$A_t = [W_{prd,1}, \ldots, W_{prd,i}, \ldots, W_{prd,N_{prd}}, W_{inj,1}, \ldots, W_{inj,i}, \ldots, W_{inj,N_{inj}}] \quad (5)$$

wherein $w_{prd,i}$ is a liquid production amount of the i-th production well, and $W_{inj,i}$ is a water injection rate of the i-th water injection well;

At step S4.2, the injection-production system $A_t$ is obtained, and the injection-production system $A_t$ is input into the oil reservoir numerical simulation model.

At step S5, based on the injection-production system $A_t$, the injection-production environment model runs the oil reservoir numerical simulation model to simulate a state of an oil reservoir at a next time step, so as to obtain state data of the moment of t+1.

At step S6, the agent reads a next state $S_{t+1}$ and an economic net present value $NPV_t$ within the time step, and places $\{S_t, A_t, S_{t+1}, NPV_t\}$ into the sample database.

Specifically, the $NPV_t$ in the step S6 is the economic net present value of the current time step, which is calculated as in Formula (6):

$$NPV_t = c_1 P_t^{oil} - c_2 P_t^{water} - c_3 I_t^{water} \quad (6)$$

wherein $P_t^{oil}$ is the accumulated oil production amount within the current time step in the unit of STB; $P_t^{water}$ is the accumulated water production amount of a block, in the unit of STB; $I_t^{water}$ is the accumulated injection amount in the unit of STB; $c_1$ is the price of crude oil, in the unit of Yuan/STB; $c_2$ is a treatment cost of oil-field-produced water, in the unit of Yuan/STB; $c_3$ is an injected water cost in the unit of Yuan/STB.

At step S7, the next state is assigned to the current state, then cycling is performed until the production period of 10 time steps is completed.

Figure 2:
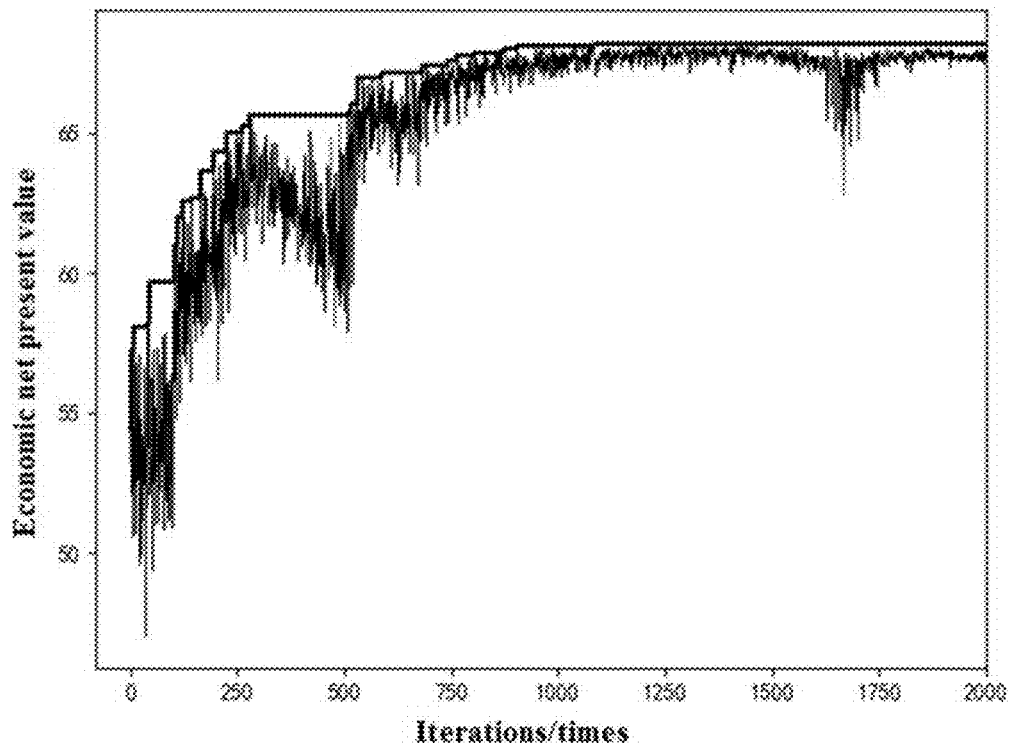
FIG. 2 is a curve of an economic net present value in a training process for an environment agent model in the present disclosure.
Figure 3:
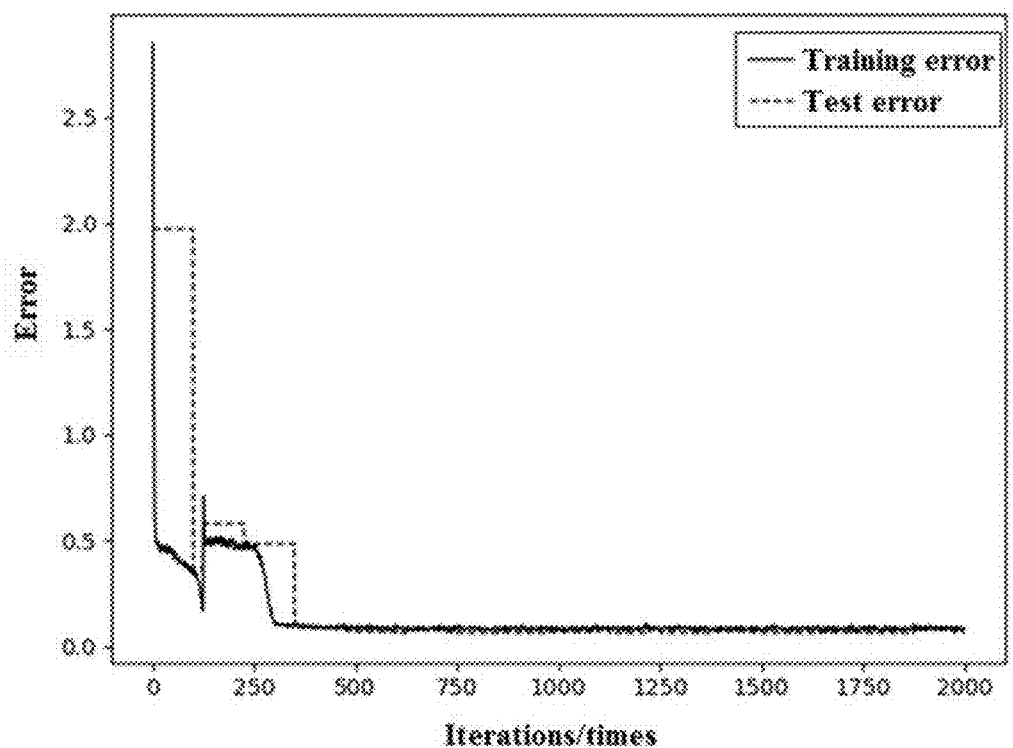
FIG. 3 is a loss curve of the environment agent model in the present disclosure.

At step S8, data sampling is performed in the sample database, and based on a sample prediction error, a weight value is assigned to the samples and a parameter of the environment agent network is updated by iteration update. From the curve of the economic net present value in the training process shown in FIG. 2, it can be seen that iteration update can obtain a maximum economic net present value. As shown in FIG. 3, the final training error of the environment agent model can reach 0.048 and the test error reaches 0.055.

Specifically, the step S8 includes the following steps:

At S8.1, sample data sampling is performed in the sample database to train the environment agent model. In the training process of the traditional neural networks, all samples are randomly sampled with equal probability. But, in an actual training process, the difficulties of training the model with different data can be different. Some samples produce a large error ratio while some produce a small error ratio. Uniform sampling may lead to lower learning efficiency. Prioritized experience replay is introduced into the present disclosure such that learning is performed as a key part for those samples producing a large error ratio during training process, increasing the convergence speed of the error function.

The sampling probability is defined as:

$$P(i) = \frac{p_i^\alpha}{\sum_k p_i^\alpha} \quad (7)$$

wherein $p_i$ is the i-th priority defined in $p_i = |\xi_i| + \delta$, wherein $\xi_i$ is a deviation between a predicted value and an actual value, $\epsilon$ is used to prevent the probability from being 0; $\alpha$ is an exponential hyperparameter and $\alpha = 0$ corresponds to uniform sampling, and k refers to the number of data samples.

At S8.2, the environment agent network is updated based on gradient descent method and a loss function used for the update is as shown in Formula (8):

$$loss(x, y) = \frac{1}{n} \sum_{i=1}^{n} |y_i - f(x_i)| \quad (8)$$

wherein $f(x_i)$ is a model prediction value of a sample $x_i$, $y_i$ is a true value, and n is a number of the collected samples.

At step S9, data sampling is performed in the sample database, and a parameter of the action evaluation network and a parameter of the injection-production policy network are updated.

Specifically, the step S9 specifically includes the following steps:

At step S9.1, sampling is performed on the samples collected in real time in the sample database, and based on the stored production data $S_t$ of the oil reservoir at the current moment, the injection-production system $A_t$ generated by the agent, the economic net present value $NPV_{t+1}$ and the oil reservoir state data $S_{t+1}$ of the next moment, a policy executed by the current injection-production policy network is evaluated and a parameter $\omega$ of the action evaluation network is updated:

$$\delta_t = NPV_{t+1} + \gamma V_\omega(s_{t+1}, A_{t+1}) - V_\omega(s_t, A_t) \quad (9)$$

$$\omega = \omega + \lambda_\omega \cdot \delta_t \nabla_\omega V_\omega(s_t, A_t) \quad (10)$$

wherein $NPV_{t+1}$ is the economic net present value of the moment t+1, $\gamma$ is a discount factor, $V_\omega(s_t, A_t)$ is an estimate of a value function of the execution action $A_t$ under the state $s_t$, $\omega$ is a parameter of a neural network, $\nabla_\omega$ refers to solving a gradient for $\omega$, $\lambda_\omega$ is a learning rate, and $\delta_t$ is a temporal differential error, which is used to evaluate a difference between an estimate value $V_\omega(s_t, A_t)$ of the state-action for the value function at the current moment and a target value $NPV_{t+1} + \gamma V_\omega(s_{t+1}, A_{t+1})$.

At step S9.2, based on the production data $S_t$ of the oil reservoir at the current moment, the injection-production system $A_t$ generated by the agent and $\delta_t$ returned by the action evaluation network, the parameter of the injection-production policy network is updated in the following Formula:

$$\theta \leftarrow \theta + \lambda_\theta \cdot \delta_t \nabla_\theta \log \pi_\theta(a_t|s_t) \quad (11)$$

wherein $\theta$ is the parameter of the injection-production policy network, $\delta_t$ is an output value of the action evaluation network, $\nabla_\theta$ refers to solving a gradient for $\theta$; $\lambda_\theta$ is the learning rate, $\pi_\theta(a_t|s_t)$ is a possibility of the execution action $a_t$ under the state $s_t$.

At step S10, the steps S4 to S9 are repeated until iteration convergence conditions are satisfied so as to obtain an optimal injection-production policy model and an environment agent model.

Specifically, the iteration convergence conditions in the step S10 include: whether the iteration number reaches a maximum upper limit of a preset stop criterion; if the preset upper limit is reached, calculation is ended and the current injection-production policy model and environment agent model are output; if not, the steps S4 to S9 are repeated.

At step 11, based on the stored optimal injection-production policy model, oil reservoir state information obtained by the intelligent injection-production device is input into the optimal injection-production policy model to output a complete production system and realize real-time injection-production optimization.

As shown in FIGS. 4 and 5, in the method of the present disclosure, a high-quality decision solution can be provided for reasonable production configuration and injection-production policy adjustment, so as to achieve the purpose of producing more oil and less water in the oil field. Compared with performing injection-production optimization based on heuristic algorithm, an association relationship between production state and optimization can be embedded. Further, compared with the previous injection-production optimization method with the field data as input, better combination with the actual production state can be achieved. Furthermore, the model does not need to perform historical fitting and numerical simulation again but directly performs adjustment and correction to the injection-production policy subsequently based on the actual production data.

Of course, the above descriptions are not used to limit the present disclosure and the present disclosure is not limited to the above examples. Any changes, variations, additions or replacements made by those skilled in the arts within the essence of the present disclosure shall fall within the scope of protection of the present disclosure.

The invention claimed is:

1. A differentiated real-time injection-production optimization adjustment method of an intelligent injection-production linkage device, comprising the following steps:

S1, initializing an injection-production policy network, an action evaluation network and an environment agent neural network;

the step S1 specifically comprises the following steps:

S1.1, using $\theta$ parameterized neural network $\pi_\theta(S_t)$ to represent the injection-production policy network, wherein the input of the injection-production policy network is the state $S_t$ observed by the agent and the output of the injection-production policy network is the injection-production system $A_t$ of the oil/water well;

based on the numbers of oil wells and water wells, setting the numbers of input neurons and output neurons;

wherein the specific input information comprises a daily liquid production amount, a daily oil production amount, an accumulated liquid production amount, an accumulated injection amount, a water cut, a daily injection amount, and a downhole pressure of the oil/water well, which are input in the form of vector, and the above information is measured and recorded in real time in a production process of an oil field;

S1.2, using $\omega$ parameterized neural network $V_\omega(S_t, A_t)$ to represent the action evaluation network, wherein the input of the action evaluation network is the state $S_t$ and the injection-production system $A_t$ of the oil/water well, and the output of the action evaluation network is a Net Present Value (NPV) prediction value calculated based on the injection-production system $A_t$ under the state $S_t$;

S1.3, parameterize the environment agent neural network $U_\phi(S_t, A_t)$ using $\phi$, wherein the input is the current state $S_t$ and the injection-production system $A_t$, and the output is the next state $S_{t+1}$;

S2, based on to-be-optimized oil reservoir numerical simulation model, writing an injection-production environment model, wherein the injection-production environment model comprises a file reading module and a system writing module, the file reading module completes state reading function and the system writing module achieves environment state transfer;

the injection-production environment model in the step S2 comprises a state transfer part, a state reading part and a reward obtaining part:

the state transfer part is used to transfer the injection-production environment model from the current state $S_t$ to the next state $S_{t+1}$ based on the injection-production system, wherein the state transfer is performed based on the oil-water two-phase flow equations of Formula (1), Formula (2) and Formula (3);

$$v_w = -\frac{KK_{rw}}{\mu_w}\nabla p_w \quad (1)$$

$$v_o = -\frac{KK_{ro}}{\mu_o}\nabla p_o \quad (2)$$

$$p_c = p_o - p_w \quad (3)$$

wherein $p_c$ is a capillary pressure in the unit of kPa; $v_w$ and $v_o$ are seepage velocities of the water phase and the oil phase in the unit of cm/s; $\mu_o$ and $\mu_w$ are viscosities of oil and water respectively in the unit of mPa·s; $p_w$ and $p_o$ are pressures of the water phase and the oil phase, in the unit of kPa; K is an absolute permeability of rocks, in the unit of um$^2$; $K_{rw}$ and $K_{ro}$ are relative permeabilities of the water phase and the oil phase, wherein this step is performed based on the oil reservoir numerical simulation model;

the state reading part is used to read the state observed by the agent, wherein the state observed by the agent is production log data recorded in real time in an oil field production site, as shown in Formula (4);

$$s_t = \begin{cases} wopt_{o,1}, \ldots, wopt_{o,i}, \ldots, wopt_{o,n}, wopr_{o,1}, \ldots, wopr_{o,i}, \ldots, wopr_{o,n}, \\ wlpt_{o,1}, \ldots, wlpt_{o,i}, \ldots, wlpt_{o,n}, wlpr_{o,1}, \ldots, wlpr_{o,i}, \ldots, wlpr_{o,n}, \\ wwit_{w,1}, \ldots, wwit_{w,i}, \ldots, wwit_{w,m}, wwir_{w,1}, \ldots, wwir_{w,i}, \ldots, wwir_{w,m}, \\ wbhp_{o,1}, \ldots, wbhp_{o,i}, \ldots, wbhp_{o,n}, wbhp_{w,1}, \ldots, wbhp_{w,i}, \ldots, wbhp_{w,m} \end{cases} \quad (4)$$

wherein $wopt_{o,i}$ is the accumulated oil production amount of the i-th oil well, $wopr_{o,i}$ is the daily oil production amount of the i-th oil well, $wlpt_{o,i}$ is the accumulated liquid production amount of the i-th oil well, wlpr$_{o,i}$ is the daily liquid production amount of the i-th oil well, wwit$_{w,i}$ is the accumulated injection amount of the i-th water well, wwir$_{w,i}$ is the daily injection amount of the i-th water well, wbhp$_{o,i}$ is the downhole pressure of the i-th oil well, and wbhp$_{w,i}$ is the downhole pressure of the i-th water well;

the reward obtaining part performs calculation of the economic net present value by reading the accumulated oil production amount, the accumulated water production amount and the accumulated water injection amount of the oil reservoir numerical simulation model in an optimization stage;

S3, by agents the injection-production policy network and the action evaluation network, reading an initial state of an injection-production environment based on reading injection-production amount data $S_0$ of an oil/water well at the moment of $t_0$;

in the step S3, the injection-production amount data $S_0$ of the oil/water well at the moment $t_0$ comprises: a daily liquid production amount, a daily oil production amount, an accumulated liquid production amount, an accumulated oil production amount, a water cut, a daily injection amount, an accumulated injection amount, and a downhole pressure of the oil/water well, wherein the above data is input in the form of vector;

S4, inputting a current state $S_t$ into an injection-production policy model, outputting an injection-production system $A_t$ and writing the injection-production system $A_t$ into the oil reservoir numerical simulation model;

S5, based on the injection-production system $A_t$, running, by the injection-production environment model, the oil reservoir numerical simulation model to simulate a state of an oil reservoir at a next time step, so as to obtain state data of the moment of t+1;

S6, reading, by the agent, a next state $s_{t+1}$ and an economic net present value NPV$_t$ within the time step and placing $\{S_t, A_t, S_{t+1}, NPV_t\}$ into a sample database;

S7, assigning the next state to the current state, based on letting $S_t=S_{t+1}$, then performing cycling until a to-be-optimized production period is completed;

S8, performing data sampling in the sample database, and based on a sample prediction error, assigning a weight value to the samples and updating a parameter of the environment agent neural network by iteration update;

the step S8 specifically comprises the following steps:

S8.1, performing sample data sampling in the sample database to train the environment agent model and define a sampling probability as:

$$P(i) = \frac{p_i^\alpha}{\sum_k p_i^\alpha} \quad (7)$$

wherein $p_i$ is the i-th priority defined in $p_i=|\xi_i|+\delta$, wherein $\xi_i$ is a deviation between a predicted value and an actual value, $\delta$ is used to prevent the probability from being 0; $\alpha$ is an exponential hyperparameter and $\alpha=0$ corresponds to uniform sampling, and k refers to the number of data samples;

S8.2, updating the environment agent neural network based on gradient descent method and a loss function used for the update is as shown in Formula (8):

$$loss(x, y) = \frac{1}{n}\sum_{i=1}^{n}|y_i - f(x_i)| \quad (8)$$

wherein $f(x_i)$ is a model prediction value of a sample $x_i$, $y_i$ is a true value, and n is a number of the collected samples;

S9, performing data sampling in the sample database, and updating a parameter of the action evaluation network and a parameter of the injection-production policy network;

S10, repeating the steps S4 to S9 until iteration convergence conditions are satisfied so as to obtain an optimal injection-production policy model and an environment agent model;

S11, based on the stored optimal injection-production policy model, inputting oil reservoir state information obtained by the intelligent injection-production device into the optimal injection-production policy model to output a complete production system and realize real-time injection-production optimization.

2. The differentiated real-time injection-production optimization adjustment method of claim 1, wherein the step S4 specifically comprises the following steps:

S4.1, outputting, by the injection-production policy model, the injection-production system $A_t$, as shown in Formula (5):

$$A_t = [W_{prd,1}, \ldots, W_{prd,i}, \ldots, W_{prd,N_{prd}}, \\ W_{inj,1}, \ldots, W_{inj,i}, \ldots, W_{inj,N_{inj}}] \quad (5)$$

wherein $W_{prd,i}$ is a liquid production amount of the i-th production well, and $W_{inj,i}$ is a water injection rate of the i-th water injection well;

S4.2, obtaining the injection-production system $A_t$, and inputting the injection-production system $A_t$ into the oil reservoir numerical simulation model.

3. The differentiated real-time injection-production optimization adjustment method of claim 1, wherein the NPV$_t$ in the step S6 is the economic net present value of the current time step, calculated as in Formula (6):

$$NPV_t = c_1 P_t^{oil} - c_2 P_t^{water} - c_3 I_t^{water} \quad (6)$$

wherein $P_t^{oil}$ is the accumulated oil production amount within the current time step in the unit of stock tank barrel (STB); $P_t^{water}$ is the accumulated water production amount of a block, in the unit of STB; $I_t^{water}$ is the accumulated injection amount in the unit of STB; $c_1$ is the price of crude oil, in the unit of Yuan/STB; $c_2$ is a treatment cost of oil-field-produced water, in the unit of Yuan/STB; $c_3$ is an injected water cost in the unit of Yuan/STB.

4. The differentiated real-time injection-production optimization adjustment method of claim 1, wherein the step S9 specifically comprises the following steps:

S9.1, performing sampling on the samples collected in real time in the sample database, and based on the stored production data $S_t$ of the oil reservoir at the current moment, the injection-production system $A_t$ generated by the agent, the economic net present value $NPV_{t+1}$ and the oil reservoir state data $S_{t+1}$ of the next moment, evaluating a policy executed by the current injection-production policy network and updating a parameter CO of the action evaluation network:

$$\delta_t = NPV_{t+1} + \gamma V_\omega(s_{t+1}, A_{t+1}) - V_\omega(s_t, A_t) \quad (9)$$

$$\omega = \omega + \lambda_\omega \cdot \delta_t \nabla_\omega V_\omega(s_t, A_t) \quad (10)$$

wherein $NPV_{t+1}$ is the economic net present value of the moment t+1, $\gamma$ is a discount factor, $V_\omega(s_t, A_t)$ is an estimate of a value function of the execution action $A_t$ under the state $s_t$, $\omega$ is a parameter of a neural network, $\nabla_\omega$ refers to solving a gradient for $\omega$, $\lambda_\omega$ is a learning rate, and $\delta_t$ is a temporal differential error;

S9.2, based on the production data $S_t$ of the oil reservoir at the current moment, the injection-production system $A_t$ generated by the agent and $\delta_t$ returned by the action evaluation network, updating the parameter $\theta$ of the injection-production policy network in the following Formula:

$$\theta \leftarrow \theta + \lambda_\theta \cdot \delta_t \cdot \nabla_\theta \log \pi_\theta(a_t|s_t) \tag{11}$$

wherein $\theta$ is the parameter of the injection-production policy network, $\delta_t$ is an output value of the action evaluation network, $\nabla_\theta$ refers to solving a gradient for $\theta$; $\lambda_\theta$ is the learning rate, $\pi_\theta(a_t|s_t)$ is a possibility of the execution action $a_t$ under the state $s_t$.

5. The differentiated real-time injection-production optimization adjustment method of claim 1, wherein the iteration convergence conditions in the step S10 comprise: whether the iteration number reaches a maximum upper limit of a preset stop criterion; if the preset upper limit is reached, calculation is ended and the current injection-production policy model and environment agent model are output; if not, the steps S4 to S9 are repeated.

* * * * *